(12) United States Patent
Um

(10) Patent No.: US 8,876,976 B2
(45) Date of Patent: Nov. 4, 2014

(54) CHEMICAL VAPOR DEPOSITION APPARATUS FOR EQUALIZING HEATING TEMPERATURE

(75) Inventor: Pyung-yong Um, Kyungki-do (KR)

(73) Assignee: Eugene Technology Co., Ltd., Gyeonggi-do (KR)

( * ) Notice: Subject to any disclaimer, the term of this patent is extended or adjusted under 35 U.S.C. 154(b) by 700 days.

(21) Appl. No.: 12/447,918

(22) PCT Filed: Nov. 1, 2007

(86) PCT No.: PCT/KR2007/005487
§ 371 (c)(1),
(2), (4) Date: Apr. 30, 2009

(87) PCT Pub. No.: WO2008/054153
PCT Pub. Date: May 8, 2008

(65) Prior Publication Data
US 2010/0043709 A1 Feb. 25, 2010

(30) Foreign Application Priority Data
Nov. 2, 2006 (KR) ........................ 10-2006-0107970

(51) Int. Cl.
C23C 14/50 (2006.01)
(Continued)

(52) U.S. Cl.
CPC .......... *H01L 21/67103* (2013.01); *C23C 16/46* (2013.01)
USPC ...... 118/724; 118/725; 118/728; 156/345.51; 156/345.52

(58) Field of Classification Search
USPC .......... 118/724, 725, 728; 156/345.52, 345.51
See application file for complete search history.

(56) References Cited

U.S. PATENT DOCUMENTS 4,347,431 A * 8/1982 Pearce et al. ................... 219/390
5,062,386 A * 11/1991 Christensen ................... 118/725
(Continued)

FOREIGN PATENT DOCUMENTS

JP 8-37193 A 2/1996
JP 2000-58471 A 2/2000
(Continued)

OTHER PUBLICATIONS

Matweb. www.matweb.com. Material Property for nickel. Jul. 2013.*

(Continued)

*Primary Examiner* — Rudy Zervigon
(74) *Attorney, Agent, or Firm* — Rabin & Berdo, P.C.

(57) ABSTRACT

Disclosed is a chemical vapor deposition apparatus for equalizing a heating temperature, which maintains the heating temperature of a heater provided therein uniform not only on the lower surface of the heater but also on the upper surface thereof, so that a thin film having a uniform thickness is deposited on a wafer. In order to maintain the heating temperature of the heater of the chemical vapor deposition apparatus uniform, the chemical vapor deposition apparatus includes a thermal insulation reflecting plate for reflecting heat from the lower surface of the heater and a heat dissipation member disposed between the thermal insulation reflecting plate and the heater to be in direct contact with the area of the heater having a high temperature, or includes a heat dissipation member mounted underneath the area of the heater having a high temperature. Also, the apparatus includes a depression having a predetermined shape in the surface of the area of the heater having a relatively high temperature coming into direct contact with a wafer, and further includes a heat dissipation member disposed between the thermal insulation reflecting plate and the heater to be in contact with the area of the heater having a high temperature to thus decrease reflected heat, thereby equalizing the temperatures of the upper and lower surfaces of the heater.

8 Claims, 4 Drawing Sheets

(51) Int. Cl.
*C23C 14/54* (2006.01)
*C23C 16/48* (2006.01)
*C23C 16/50* (2006.01)
*C23C 16/46* (2006.01)
*C23C 16/453* (2006.01)
*C23C 14/46* (2006.01)
*H01L 21/67* (2006.01)
*C23C 16/06* (2006.01)
*C23C 16/22* (2006.01)

(56) References Cited

U.S. PATENT DOCUMENTS

| | | | | |
|---|---|---|---|---|
| 5,280,156 | A * | 1/1994 | Niori et al. | 219/385 |
| 5,306,895 | A * | 4/1994 | Ushikoshi et al. | 219/385 |
| 5,460,684 | A * | 10/1995 | Saeki et al. | 156/345.51 |
| 5,462,603 | A * | 10/1995 | Murakami | 118/719 |
| 5,653,808 | A * | 8/1997 | MacLeish et al. | 118/715 |
| 5,660,472 | A * | 8/1997 | Peuse et al. | 374/128 |
| 5,683,518 | A * | 11/1997 | Moore et al. | 118/730 |
| 5,710,407 | A * | 1/1998 | Moore et al. | 219/405 |
| 5,800,618 | A * | 9/1998 | Niori et al. | 118/723 E |
| 5,964,947 | A * | 10/1999 | Zhao et al. | 118/715 |
| 6,035,100 | A * | 3/2000 | Bierman et al. | 392/416 |
| 6,064,800 | A * | 5/2000 | Sandhu | 392/416 |
| 6,080,965 | A * | 6/2000 | Osawa | 219/405 |
| 6,099,650 | A * | 8/2000 | Carbonaro et al. | 118/715 |
| 6,101,969 | A * | 8/2000 | Niori et al. | 118/723 E |
| 6,104,002 | A * | 8/2000 | Hirose et al. | 219/390 |
| 6,157,106 | A * | 12/2000 | Tietz et al. | 310/90.5 |
| 6,191,397 | B1 * | 2/2001 | Hayasaki et al. | 219/497 |
| 6,197,246 | B1 * | 3/2001 | Niori et al. | 264/618 |
| 6,198,074 | B1 * | 3/2001 | Savas | 219/390 |
| 6,331,697 | B2 * | 12/2001 | Savas | 219/390 |
| 6,364,954 | B2 * | 4/2002 | Umotoy et al. | 118/715 |
| 6,444,084 | B1 * | 9/2002 | Collins | 156/345.1 |
| 6,466,426 | B1 | 10/2002 | Mok et al. | |
| 6,534,751 | B2 * | 3/2003 | Uchiyama et al. | 219/444.1 |
| 6,646,233 | B2 * | 11/2003 | Kanno et al. | 219/390 |
| 6,688,375 | B1 * | 2/2004 | Turner et al. | 165/48.1 |
| 6,740,853 | B1 * | 5/2004 | Johnson et al. | 219/444.1 |
| 6,951,587 | B1 * | 10/2005 | Narushima | 118/728 |
| 7,033,444 | B1 * | 4/2006 | Komino et al. | 118/725 |
| 7,071,551 | B2 * | 7/2006 | Hiramatsu et al. | 257/710 |
| 7,247,818 | B2 * | 7/2007 | Kondou et al. | 219/444.1 |
| 7,337,745 | B1 * | 3/2008 | Komino et al. | 118/723 E |
| 7,658,801 | B2 * | 2/2010 | Arami | 118/725 |
| 8,198,567 | B2 * | 6/2012 | Lerner et al. | 219/390 |
| 8,226,769 | B2 * | 7/2012 | Matyushkin et al. | 118/728 |
| 8,394,199 | B2 * | 3/2013 | Tomita et al. | 118/715 |
| 2003/0047283 | A1 * | 3/2003 | Parkhe et al. | 156/345.51 |
| 2004/0226515 | A1 | 11/2004 | Yendler et al. | |
| 2005/0166848 | A1 * | 8/2005 | Natsuhara et al. | 118/728 |
| 2010/0039747 | A1 * | 2/2010 | Sansoni et al. | 361/234 |
| 2010/0059182 | A1 * | 3/2010 | Lee et al. | 156/345.52 |

FOREIGN PATENT DOCUMENTS

| | | |
|---|---|---|
| JP | 2005-005503 A | 1/2005 |
| KR | 1020010030052 A | 4/2001 |
| KR | 1020030047510 A | 6/2003 |
| WO | 2004/070803 A1 | 8/2004 |
| WO | 2006/016764 A1 | 2/2006 |

OTHER PUBLICATIONS

Matweb.com material data sheet for mullite. Mar. 3, 2014.*
International Search Report: mailed Mar. 12, 2008; PCT/KR2007/005487.

* cited by examiner

CHEMICAL VAPOR DEPOSITION APPARATUS FOR EQUALIZING HEATING TEMPERATURE

TECHNICAL FIELD

The present invention relates to a chemical vapor deposition (CVD) apparatus for equalizing a heating temperature, which maintains the heating temperature of a heater provided therein uniform not only on the lower surface of the heater but also on the upper surface thereof, so that a thin film having a uniform thickness is deposited on a wafer.

BACKGROUND ART

Generally, when a reactive gas is applied on the upper surface of a wafer, the temperature of which is increased, it is deposited thereon through a chemical reaction facilitated by heat. As such, in the case where the temperature of the wafer is not uniformly increased, part of the thin film is deposited on the wafer differently from the intended design specification, undesirably causing subsequently produced semi-conductor devices to be defective.

The heating temperature of a heater mounted in a conventional CVD apparatus varies depending on the production environment.

Therefore, the case where the heating temperature of the heater is not uniform causes variation in the amount of heat that is transferred to the wafer, whereby the wafer has a temperature different from that of the design specification, thus making it difficult to form a uniform deposition film.

That is, in the case where the heating temperature of the heater is different in portions thereof, the thin film may be deposited thickly over the area of the heater having a relatively high temperature, or may be deposited thinly over the area of the heater having a relatively low temperature, and thus the deposition film may be non-uniformly formed on the wafer.

FIGS. 1 and 2 are schematic views illustrating a conventional CVD apparatus for depositing a thin film on a wafer, and a high temperature area A and a low temperature area L of the heater.

As illustrated in the drawings, the conventional CVD apparatus includes a process chamber 100, in which the deposition of a thin film is carried out. In the process chamber 100, a shower head 102 for spraying a reactive gas and a heater 103 formed of ceramic or AlN, on which a wafer is placed, are mounted. Further, the conventional CVD apparatus has an inlet gas line 101 for supplying the reactive gas into the process chamber 100, a pumping line 104 for discharging the reactive gas after deposition, a heater supporting member 105 for supporting the heater 103, a bellows 106 for protecting the heater supporting member 105, and a thermal insulation reflecting plate 120.

In order to maintain the temperature of the surface of the heater on which the wafer is placed uniform, as illustrated in FIGS. 1 and 2, the conventional CVD apparatus is characterized in that the thermal insulation reflecting plate, in which a portion thereof, corresponding to the area of the heater having a heating temperature higher or lower than the remaining area of the heater, is open, is provided below the heater using holding pins.

However, the method of emitting reflected heat downward using the thermal insulation reflecting plate having the open area formed below the heater, as mentioned above, is limited in its ability to improve the uniformity of the heating temperature because heat transfer is realized only in the form of radiation via the open area of the thermal insulation reflecting plate below the heater.

As such, heat transfer may be performed in the form of conduction by direct contact or convection by gas, in addition to the radiation, and thus there is a need to implement such heat transfer methods so as to realize increased efficiency.

DISCLOSURE OF INVENTION

Technical Problem

Accordingly, the present invention provides a CVD apparatus for equalizing a heating temperature, which is able to dissipate heat in the area of a heater having a relatively high temperature downward from the lower surface of the heater through conductive heat transfer to thus decrease the temperature of the heater.

The present invention provides a CVD apparatus, in which a heat dissipation means is applied, in place of an open area formed at a conventional thermal insulation reflecting plate for improving the uniformity of a heating temperature.

The present invention provides a CVD apparatus, in which the surface of the area of a heater having a high temperature is depressed to thus equalize the heating temperature.

The present invention provides a CVD apparatus, which is a combination type in which the depth of the depression in the surface of the heater is controlled and simultaneously the heat dissipation means is applied to the thermal insulation reflecting plate, as mentioned above.

Technical Solution

According to the present invention, a CVD apparatus for equalizing a heating temperature may include a heat dissipation member mounted underneath the heater of the CVD apparatus to dissipate heat from the lower surface of the heater through radiation heat transfer.

According to the present invention, a CVD apparatus for equalizing a heating temperature may include a thermal insulation reflecting plate mounted below a heater to reflect heat from the lower surface of the heater and a heat dissipation member formed at the area of the heater having a high temperature between the thermal insulation reflecting plate and the heater.

In the CVD apparatus, the heat dissipation member may be formed of any one material selected from among ceramic, AlN, Ni, and Inconel.

According to the present invention, a CVD apparatus for equalizing a heating temperature may include a depression formed in the surface of the area of a heater having a relatively high temperature coming into direct contact with a wafer. As such, the depression preferably has a depth of 0.005~0.5 mm.

In the CVD apparatus, a heat dissipation member may be formed at the area of the heater having a high temperature between the thermal insulation reflecting plate and the heater, and furthermore, a depression may be formed in the surface of the area of the hater having a high temperature, thereby providing a composite temperature compensation structure.

The heat dissipation member of the CVD apparatus having the composite temperature compensation structure may be formed of any one material selected from among ceramic, AlN, Ni, and Inconel.

MODE FOR THE INVENTION

Hereinafter, a detailed description will be given of preferred embodiments of the present invention, with reference to the accompanying drawings.

Figure 1:
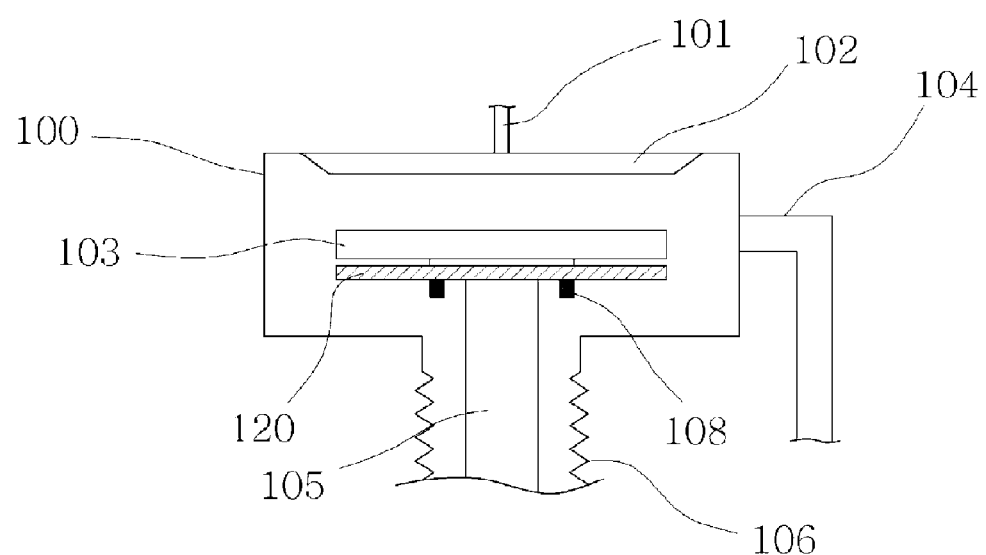
FIGS. 1 and 2 are schematic views illustrating a conventional CVD apparatus for depositing a thin film on a wafer, and a high temperature area A and a low temperature area L of a heater.
Figure 2:
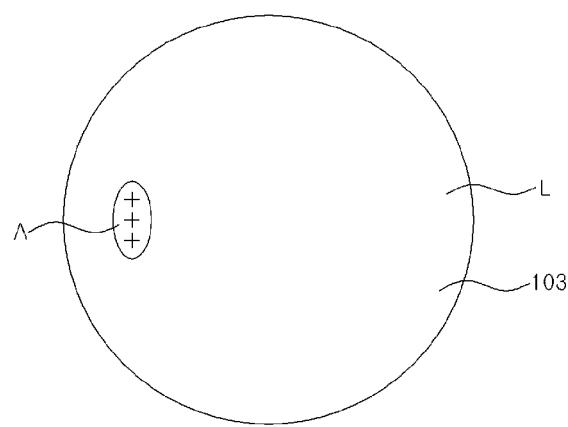
Figure 3:
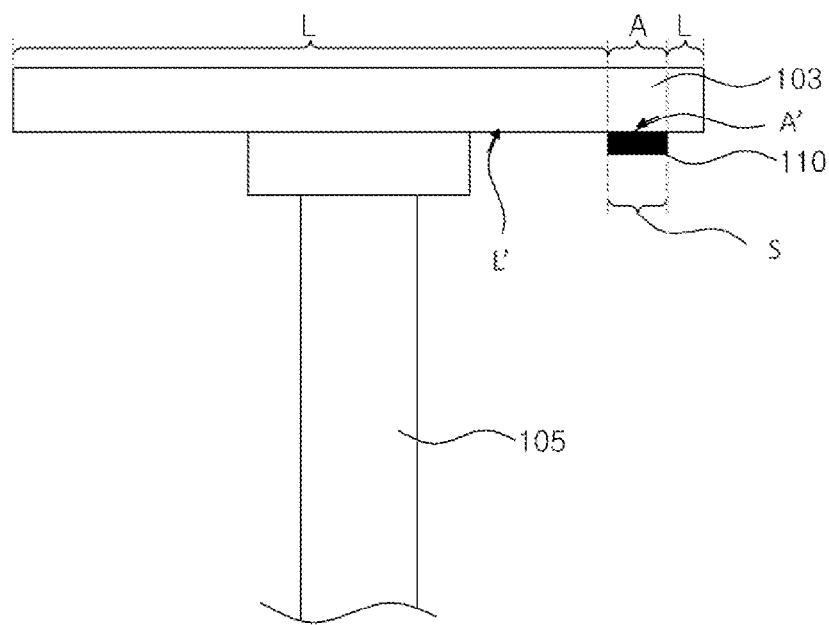
FIG. 3 is a sectional view illustrating the CVD apparatus for equalizing a heating temperature, according to a first embodiment of the present invention.

FIG. 3 is a sectional view illustrating the CVD apparatus for equalizing a heating temperature, according to a first embodiment of the present invention.

As seen in the drawing, the CVD apparatus according to the present invention is composed of a process chamber 100, an inlet gas line 101, a shower head 102, a heater 103, a pumping line 104, a heater supporting member 105, and a bellows 106, as in a conventional CVD apparatus.

Underneath the heater 103 of the CVD apparatus, according to the present invention, a heat dissipation member 110 is mounted to dissipate heat from a high temperature area A of the heater 103. The heat dissipation member 110 is mainly provided at an area A' positioned vertically below the high temperature area A of the heater 103, and is disposed to be in close contact with the area A' of the under surface of the heater 103, so that heat is conducted from the area A' of the under surface of the heater 103 to the heat dissipation member 110 to thus dissipate it. The heat dissipation member 110 may be supported by an additional supporting member (not shown), if necessary. The heat dissipation member 110 may be formed of any one material selected from among ceramic, AlN, Ni, and Inconel.

Figure 4:
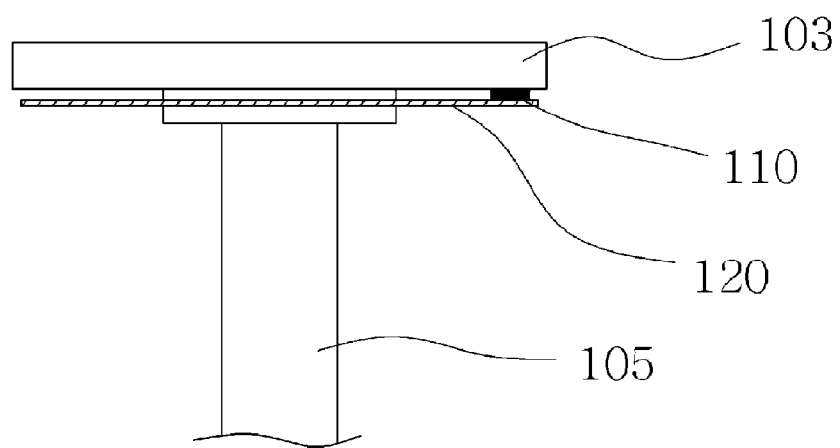
FIG. 4 is a sectional view illustrating the CVD apparatus for equalizing a heating temperature, according to a second embodiment of the present invention.

FIG. 4 is a sectional view illustrating the CVD apparatus for equalizing a heating temperature, according to a second embodiment of the present invention.

As seen in the drawing, the CVD apparatus according to the present invention is composed of a process chamber 100, an inlet gas line 101, a shower head 102, a heater 103, a pumping line 104, a heater supporting member 105, and a bellows 106, as in a conventional CVD apparatus. Further, the CVD apparatus includes a thermal insulation reflecting plate 120 mounted below the heater 103 to reflect heat from the lower surface of the heater 103, and a heat dissipation member 110 disposed between the thermal insulation reflecting plate 120 and the heater 103 such that the heat dissipation member is in direct contact with the area A' below the high temperature area A of the heater 103. The heat dissipation member 110 may be formed of any one material selected from among ceramic, AlN, Ni, and Inconel.

The heat dissipation member 110, which is disposed between the heater 103 and the thermal insulation reflecting plate 120 to be in contact with the area A' below the high temperature area A of the heater 103, functions to dissipate relatively more heat than the remaining area of the heater, to thus decrease the heating temperature.

Although only the thermal insulation reflecting plate 120 having an open area is conventionally provided to decrease high heat, in the present invention, the heat dissipation member 110 responsible for emitting high heat by force is also provided, thus enhancing the uniformity of the heating temperature.

Figure 5:
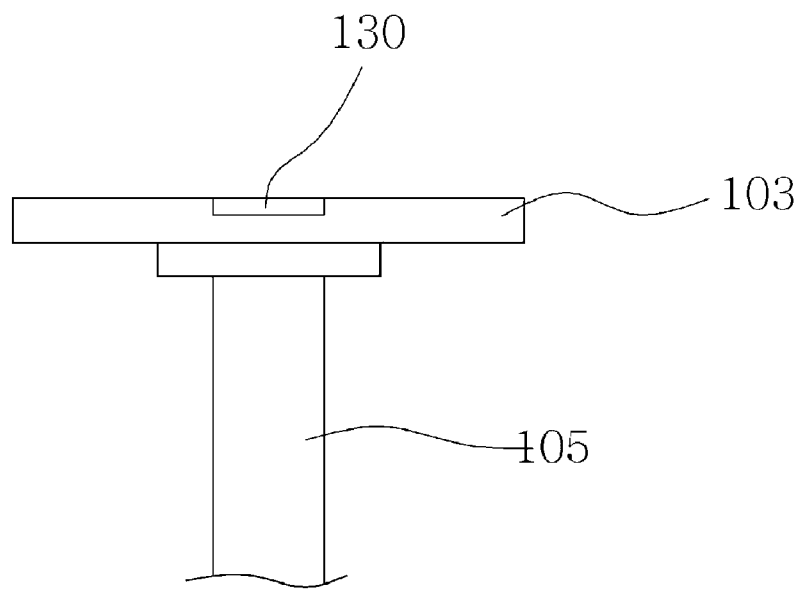
FIG. 5 is a sectional view illustrating the CVD apparatus for equalizing a heating temperature, according to a third embodiment of the present invention.

FIG. 5 is a sectional view illustrating the CVD apparatus for equalizing a heating temperature, according to a third embodiment of the present invention.

As seen in the drawing, the CVD apparatus according to the present invention is composed of a process chamber 100, an inlet gas line 101, a shower head 102, a heater 103, a pumping line 104, a heater supporting member 105, and a bellows 106, as in a conventional CVD apparatus. Further, a depression 130 having a depth of 0.005-0.5 mm is formed in the surface of an area A1 of the heater having a relatively high temperature coming into direct contact with a wafer.

The temperature of the area A1 of the heater having a high temperature is about 500~850° C. Thus, in consideration of process conditions, the depression 130 preferably has a depth of 0.005~0.5 mm.

That is, the temperature properties of the heater may be uniformly controlled by increasing the depth of the depression when the temperature is high or by decreasing the depth of the depression when the temperature is low.

In particular, the CVD apparatus for equalizing a heating temperature according to the present invention further includes a heat dissipation member 110 disposed between the heater 103 and the thermal insulation reflecting plate 120 to dissipate/decrease the heat in another area A2 of the heater 103 having a high temperature through radiation heat transfer, thereby forming a composite temperature compensation structure in which the depression 130, the heat dissipation member 110, and the thermal insulation reflecting plate 120 are provided together.

The heat dissipation member 110 may be formed of any one material selected from among ceramic, AlN, Ni, and Inconel.

Depending on the purity of material for the heater, whether or not impurities are incorporated in the process of manufacturing the heater, density differences, thermal conditions, and external effects, the area of the heater having a relatively high or low temperature may be formed when the wafer is loaded. This partial temperature difference may compensate uniformly using the CVD apparatus for equalizing a heating temperature according to the present invention, which includes only the heat dissipation member 110, only the depression 130, the combination of the thermal insulation reflecting plate 120 and the depression 130, or the combination of the thermal insulation reflecting plate 120, the depression 130, and the heat dissipation member 110.

Figure 6:
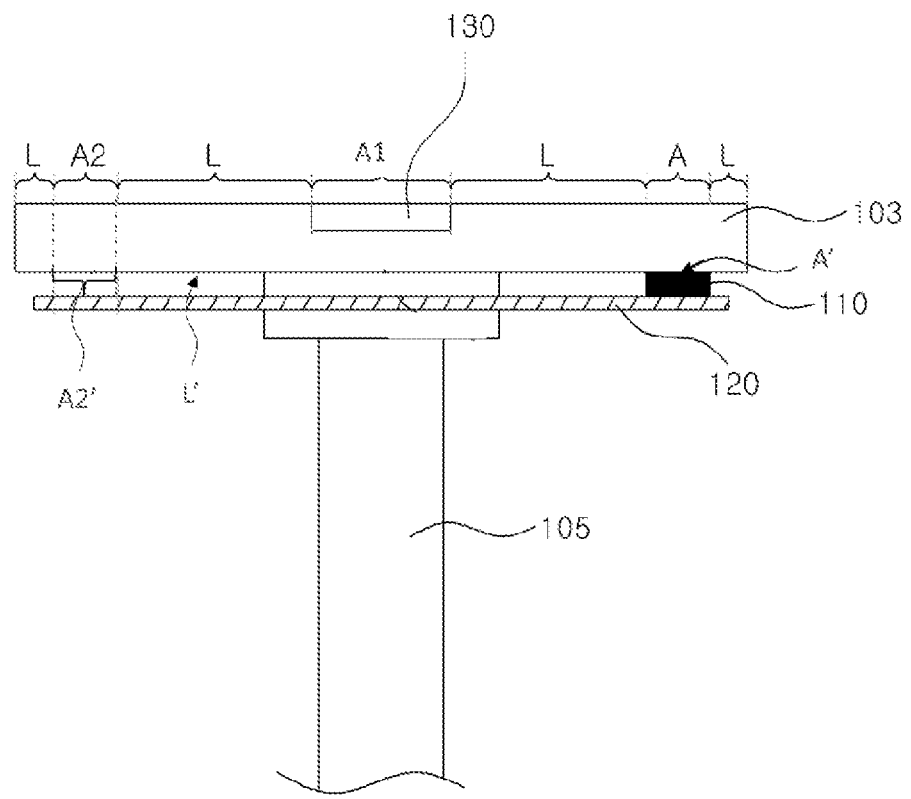
FIG. 6 is a sectional view illustrating the main components of the CVD apparatus for equalizing a heating temperature, according to the present invention.
Figure 7:
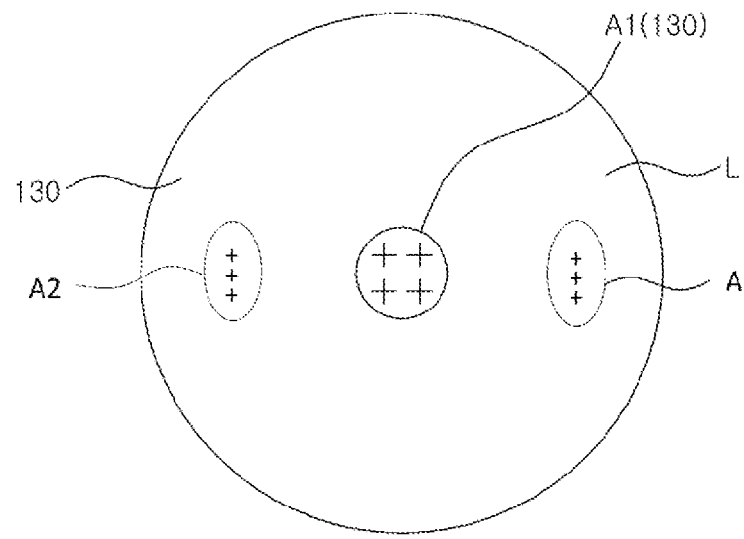
FIG. 7 is a top plan view illustrating the heater of the CVD apparatus for equalizing a heating temperature, according to the present invention.
Figure 8:
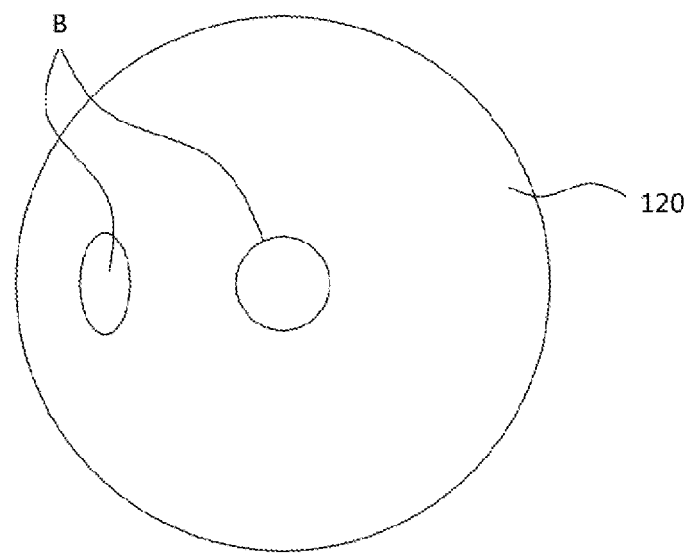
FIG. 8 is a top plan view illustrating the thermal insulation reflecting plate of the CVD apparatus for equalizing a heating temperature, according to the present invention.

FIGS. 6 to 8 illustrate the CVD apparatus for equalizing a heating temperature, according to the preferred embodiment of the present invention. FIG. 6 is a sectional view illustrating the main components of the CVD apparatus, FIG. 7 is a top plan view illustrating the heater of the CVD apparatus, and FIG. 8 is a top plan view illustrating the thermal insulation reflecting plate of the CVD apparatus, according to the present invention.

As seen in FIG. 7, of the entire area of the heater 103, at least one area having a relatively high temperature, as represented by A1 or A2, is present.

In the case where the area A1 or A2 has a higher temperature than the remaining area, i.e., the low temperature area L, of the heater 103, a deposition film on the wafer, which is placed on the area A1 or A2 of the heater, is formed thicker than the remaining area of the heater 103.

Thus, in order to equalize the temperature of the above-mentioned area, that is, to decrease the temperature of the area A, as illustrated in FIG. 6, the heat dissipation member 110 is applied between the heater 103 and the thermal insulation reflecting plate 120, and furthermore, a depression 130 having a depth of 0.005~0.5 mm is formed in a surface of the high temperature area A1 of the heater 103, thereby dissipating heat not only from the under surface of the heater 103 but also from the upper surface of the heater 103, consequently equalizing the heating temperature.

The high temperature area A1 of the heater 103, which is the area of the upper surface of the heater having a high temperature, has a shallower depression 130, and thus the temperature thereof may be maintained as in the remaining area of the heater 103, thereby equalizing the temperature of the entire area of the heater 103.

The size or installation of the heat dissipation member 110 is not limited by the position and shape thereof, but the heat dissipation member is designed to change its position and shape depending on the heating temperature of the heater 103.

That is, because the partial temperature difference of the heater 103 varies depending on the type of heater that is manufactured, the position and shape of the heat dissipation member 10 should be determined depending on the type of heater 103.

In order to eliminate the partial temperature difference of the heater 103, before the heater 103 is mounted in the chamber, the heating state is monitored to thus determine the temperature of the entire area of the heater, including the area where the partial temperature difference occurs upon heating. Thereafter, the heat dissipation member or the thermal insulation reflecting plate suitable for respective types of heaters is designed.

The thermal insulation reflecting plate 120 is preferably formed of ceramic or metal (Inconel) having high reflectivity and good thermal insulation, and is structured to surround the lower surface or the lower and side surfaces of the heater 103.

In contrast, the predetermined area of the heater 103 may have a relatively lower temperature than the remaining area thereof. In this case, as illustrated in FIG. 8 the thermal insulation reflecting plate 120 may be applied to the low temperature area L of the heater, and the thermal insulation reflecting plate 120 may have the open area B at an area facing to an area A2' which is positioned vertically below the high temperature area A2 of the heater, to thus realize heat dissipation, thereby uniformly controlling the temperature of the entire area of the heater 103.

The CVD apparatus of the present invention is characterized in that, in addition to the thermal insulation reflecting plate 120 having the structure for compensating for the temperature of the area of the heater having a relatively high or low temperature, the depression 130 is formed in the surface of the area of the heater 103 having a high temperature, thereby equalizing the temperature of the upper surface of the heater 103. In addition, the thermal insulation reflecting plate 120 may be formed below the heater 103, and thereby the open area B thereof may be selectively applied to the area A1 or A2 of the heater having a high temperature, which thus decreases the temperature of the area having a high temperature, leading to a uniform temperature.

In the case where the thermal insulation reflecting plate 120 having the open area B or the heat dissipation member 110 is selectively combined with the heater 103, the most preferable apparatus may be provided.

Through the independent structure or selective combination of the thermal insulation reflecting plate 120, the heat dissipation member 110, and the depression 130, the temperature of the entire area of the heater 103 may be equalized, and therefore a thin film may be uniformly deposited on the wafer.

INDUSTRIAL APPLICABILITY

As described hereinbefore, the prevent invention provides a CVD apparatus for equalizing a heating temperature. According to the present invention, the CVD apparatus includes a heat dissipation member mounted underneath a heater to dissipate heat of the area of the heater having a relatively high temperature downward through conductive heat transfer, thereby equalizing the heating temperature.

The CVD apparatus for equalizing heating temperatures according to the present invention solves the disadvantage of the structure of a conventional thermal insulation reflecting plate for improving the uniformity of a heating temperature, thus realizing downward heat dissipation by force.

In the CVD apparatus for equalizing a heating temperature according to the present invention, the depth of the depression in the surface of the area of the heater having a high temperature is controlled, thereby equalizing the heating temperature of the CVD apparatus.

The apparatus of the present invention is constructed in a combination type, in which the depression is formed in the surface of the area of the heater having a high temperature and the heat dissipation member is applied, or in which the depression is formed in the surface of the area of the heater having a high temperature and the thermal insulation reflecting plate is formed below the heater, thus equalizing the heating temperature. The combination type of CVD apparatus can exhibit further improved uniformity in the heating temperature compared to the above-mentioned independent type of CVD apparatus for equalizing a heating temperature.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A chemical vapor deposition apparatus for equalizing a heating temperature, the chemical vapor deposition apparatus comprising:
    a heater heating a wafer disposed thereon by heat generated from the heater, the heater having an upper surface being substantially flat and facing the wafer and an under surface being a reverse side of the upper surface and exposed to an inner space of a chamber, the heater having a low temperature area (L) and a first high temperature area (A), the under surface of the heater being substantially flat and having a first area (A') positioned vertically below the first high temperature area (A) and a second area (L') positioned vertically below the low temperature area (L) thereon; and
    a heat dissipation member disposed on the under surface of the heater, the heat dissipation member having an upper surface directly contacted with the first area (A') of the under surface of the heater to dissipate the heat of the first high temperature area (A) of the heater, the heat dissipation member having an under surface exposed to the inner space of the chamber and not contacted with the chamber, the under surface of the heat dissipation member being a reverse side of the upper surface of the heat dissipation member, the entire area (S) of the upper surface of the heat dissipation member being less than the second area (L') of the under surface of the heater, and the second area (L') of the under surface of the heater being exposed to the inner space of the chamber.

2. The chemical vapor deposition apparatus of claim 1, further comprising a thermal insulation reflecting plate mounted below and facing to the under surface of the heater to reflect the heat from the heater.

3. The chemical vapor deposition apparatus of claim 2, wherein the heater further has a second high temperature area (A2), the under surface of the heater further has a third area (A2') thereon positioned vertically below the second high temperature area (A2) of the heater in a separate place from the first area (A') of the heater, and the thermal insulation reflecting plate has an opening at a place facing to and vertically below the third area (A2') of the under surface of the heater in order to decrease reflected heat.

4. The chemical vapor deposition apparatus according to any one of claims 1 to 3, wherein the heat dissipation member is formed of any one material selected from among ceramic, AlN, Ni, and Inconel.

5. The chemical vapor deposition apparatus of claim 1, wherein the low temperature area (L) of the heater is cooled by air-cooling and the first high temperature area (A) of the heater is cooled by the heat dissipation member cooled by air-cooling.

6. The chemical vapor deposition apparatus of claim 1, wherein the heater further has a third high temperature area (A1), and the heater has a depression formed only in the third high temperature area (A1) of the heater.

7. The chemical vapor deposition apparatus of claim 1, further comprising a thermal insulation reflecting plate mounted below and facing to the under surface of the heater to reflect the heat from the heater, wherein the under surface of the heat dissipation member is directly contacted with an upper surface of the thermal insulation reflecting plate instead of being exposed to the inner space of the chamber.

8. The chemical vapor deposition apparatus of claim 7, wherein the heater further has a second high temperature area (A2), the under surface of the heater further has a third area (A2') thereon positioned vertically below the second high temperature area (A2) of the heater in a separate place from the first area (A') of the heater, and the thermal insulation reflecting plate has an opening at a place facing to and vertically below the third area (A2') of the under surface of the heater in order to decrease reflected heat.

* * * * *